United States Patent [19]
Haq et al.

[11] Patent Number: 6,162,073
[45] Date of Patent: Dec. 19, 2000

[54] HOT PLUG STRUCTURE AND METHOD FOR ENGAGING/DISENGAGING PCI COMPLIANT CARD

[75] Inventors: Mohammed N. Haq, Lacey; Russell S. Aoki, Kent, both of Wash.

[73] Assignee: Intel Corporation, Santa Clara, Calif.

[21] Appl. No.: 09/223,811

[22] Filed: Dec. 31, 1998

[51] Int. Cl.$^7$ .................................................. H01R 13/62
[52] U.S. Cl. ......................... 439/159; 439/160; 439/377
[58] Field of Search .................................. 439/159, 160, 439/152, 157, 64, 377; 361/798

[56] References Cited

U.S. PATENT DOCUMENTS

| | | | |
|---|---|---|---|
| 5,644,470 | 7/1997 | Benedict et al. | 439/160 |
| 5,657,204 | 8/1997 | Hunt | 439/377 |

*Primary Examiner*—Gary F. Paumen
*Assistant Examiner*—Tho D. Ta
*Attorney, Agent, or Firm*—Antonelli, Terry, Stout & Kraus, LLP

[57] ABSTRACT

Structure and methods are provided for engaging/disengaging (1) a peripheral component interconnect (PCI) compliant card and (2) a slot therefor on a baseboard of a computer, without having to power down the system or remove any computer chassis components. The structure includes a bracket to hold the PCI compliant card, as a first part of the structure. The bracket slides into a channel of a second part of the structure, this second part having the engagement/disengagement mechanism built into it. The engagement/disengagement mechanism includes a camming structure which rotates to press against the channel and forces it downward (thereby forcing the PCI compliant card, held by the bracket in the channel, downward), to engage the electrical contacts of the PCI compliant card to electrical connectors in the slot. Upon release of the camming structure, a spring of the engagement/disengagement mechanism forces the channel upward to disengage the PCI compliant card from the slot. The engagement/disengagement mechanism includes ejection structure to eject the bracket (and PCI compliant card held thereby) from the channel when the PCI compliant card has risen above the slot.

23 Claims, 4 Drawing Sheets

HOT PLUG STRUCTURE AND METHOD FOR ENGAGING/DISENGAGING PCI COMPLIANT CARD

FIELD

The present invention is directed to a hot plug peripheral component interconnect (PCI) structure, and methods of operating such structure.

BACKGROUND

Modern computer systems, such as servers, workstations and personal computers, include cards that comply with the PCI bus specification, the latest version of which is "PCI Local Bus Specification, Revision 2.1", set forth by the PCI Special Interest Group (SIG) on Jun. 1, 1995. Hereinafter, such cards in compliance with the PCI bus specification (that can be electrically connected to PCI busses complying with the PCI bus specification) are called PCI compliant cards.

Currently, there is an exemplary top access hot plug structure, to engage/disengage PCI compliant cards with/from slots therefor in the system (e.g., computer), without powering down the system. This top access structure requires entry and removal of the PCI compliant card vertically, through the top of the, e.g., computer chassis or frame. However, this structure has various disadvantages, including a requirement of an undue amount of space.

Currently, there is no hot plug mechanism available in the market, which can be used to insert and remove PCI compliant cards horizontally from a rear of the chassis.

SUMMARY

The present invention, in various embodiments includes a hot plug component, for engaging a PCI compliant card in a slot therefor, e.g., in a base board of the computer. The hot plug component includes a hot plug biasing mechanism and a hot plug channel member integrated with the hot plug biasing mechanism. The hot plug channel member holds the PCI compliant card. The hot plug biasing mechanism includes a camming structure, the hot plug channel member co-acting with the camming structure to move the hot plug channel member so that the PCI compliant card enters the slot therefor when the camming structure moves in a first direction.

DETAILED DESCRIPTION

Figure 1:
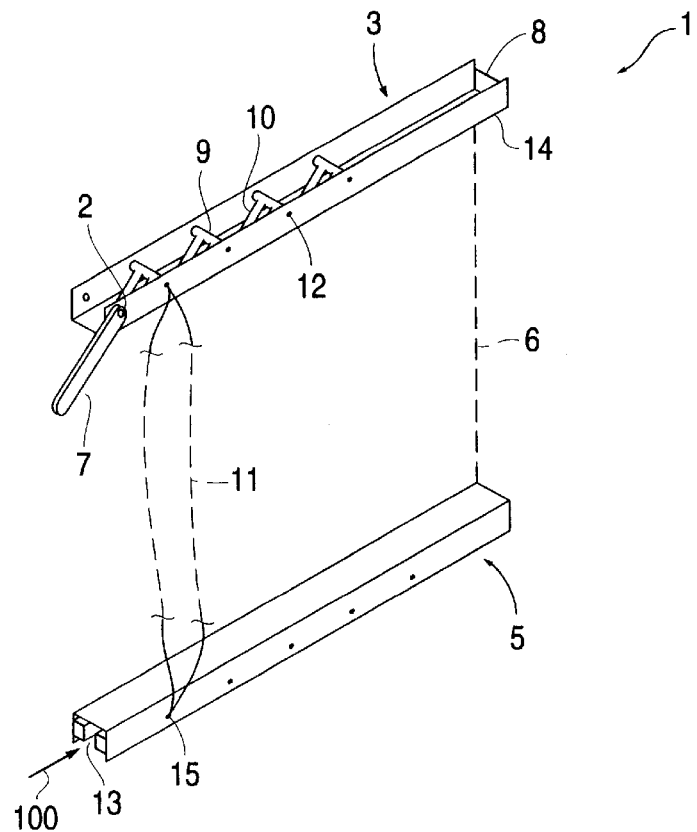
FIG. 1 is a perspective exploded view of an example of a hot plug component, having a hot plug biasing mechanism and hot plug channel member, of a first example and illustrative embodiment of the present invention.

While the invention will be described in connection with specific examples and illustrative embodiments, it will be understood that it is not intended to limit the invention to those examples and illustrative embodiments. To the contrary, it is intended to cover all alterations, modifications and equivalents as may be included within the spirit and scope of the invention as defined by the appended claims.

Illustrative and exemplary embodiments of the present invention, in the following, are described in connection with the various drawing figures. Various components in the drawing figures having corresponding functions are referred to using common reference numerals.

FIG. 1 is an exploded perspective view of an example of a hot plug component 1. This hot plug component 1 has two parts, hot plug biasing mechanism 3 and hot plug channel member 5. These two parts of hot plug component 1 are integrated, as shown schematically by connection line 6. The hot plug biasing mechanism 3 includes a frame 14; and also includes actuating mechanism 7 (e.g., a lever), which upon rotation around its pivot point 2 causes (through appropriate mechanical interconnection or force transfer) camming fingers 10 of a camming structure 9 to rotate around their pivot points 12. In rotating the camming structure 9 downward from the position shown in FIG. 1 (the fingers 10 rotating counter-clockwise around their respective pivot points 12 in FIG. 1), the camming fingers force or bias the hot plug channel member 5 downward, so as to move the hot plug channel member 5 vertically downward. As seen in FIG. 1, and seen more clearly in FIG. 5, the hot plug biasing mechanism 3 and hot plug channel member 5 are connected to each other by, e.g., spring clips 11, which are connected respectively to the hot plug biasing mechanism 3 at connection (i.e., pivot) points 12 and to the hot plug channel member 5 at the connection points 15. When the PCI compliant card is engaged in the slot therefor, the spring clips 11 have a memory in a direction urging the hot plug channel member 5 toward frame 14 of hot plug biasing mechanism 3, so as to move (i.e., spring bias) the hot plug channel member 5 back toward the frame 14 upon rotating the front lever 7, e.g., in a clockwise direction to remove force from the camming structure 9 on the hot plug channel member 5. Also shown in FIG. 1 is a channel opening 13 of hot plug channel member 5, having an H-shaped open end for receiving insertion (in a direction designated by arrow 100) of an appropriate PCI compliant card configuration.

Figure 2:
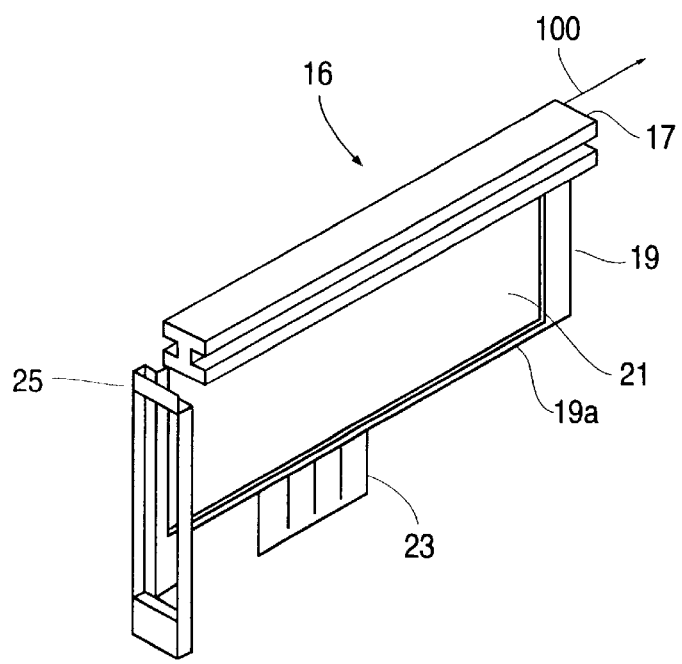
FIG. 2 is a perspective view of an example of a bracket holding a PCI compliant card, according to an example and illustrative embodiment of the present invention.

More particularly, FIG. 2 shows an example of a PCI compliant card configuration of the present invention, and especially a bracket 16. This bracket 16 includes hot plug slide beam (cartridge) 17 and member 19, with slide beam 17 being meant for making insertion/sliding (in direction designated by arrow 100). This member 19 may extend along the back edge of the PCI compliant card and, as seen in the embodiment shown in FIG. 2, may also include portion 19a extending along the bottom edge of the PCI compliant card 21. As can be seen in FIG. 2, the electrical contacts 23 of the PCI compliant card 21, which are adapted to contact electrical connectors in a slot therefor (not shown), may extend beyond the portion of the member 19a extending along the bottom edge of the PCI compliant card 21. Possible purposes of the member 19 and portion 19a are to add rigidity and/or framing to a PCI compliant card, and to facilitate mounting of the PCI compliant card. Also shown in FIG. 2 is bracket 25 at the front end of PCI compliant card 21.

Figure 5:
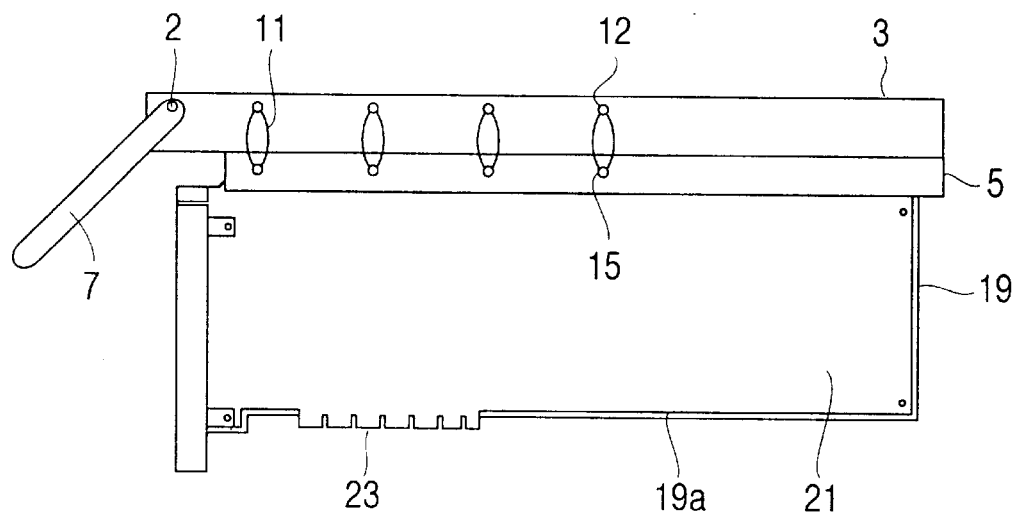
FIG. 5 is a side view of an example of a hot plug structure, according to an example and illustrative embodiment of the present invention.

As can be appreciated from FIGS. 1, 2 and 5, in operation the hot plug channel member 5 is normally (e.g., without lever biasing) raised to a position closest to the hot plug biasing mechanism 3. Note, for example, the positions of the hot plug biasing mechanism 3 and hot plug channel member 5 in FIG. 5. While so positioned, the hot plug slide beam 17 of the bracket 16, carrying a PCI compliant card 21, is slid fully into channel opening 13 of the hot plug channel member 5. When slid completely into the channel opening 13, the bracket 16 (and, correspondingly, the PCI compliant card 21) are held by the hot plug channel member 5.

Thereafter, the actuating mechanism 7 is rotated (e.g., manually by a user, or by other arrangements) counterclockwise so as to rotate camming structure 9 and camming fingers 10. The camming fingers 10 push the hot plug channel member 5, and bracket 16 and PCI compliant card 21 held thereby, downward, unflexing spring clips 11, so that the electrical contacts 23 of the PCI compliant card 21 can enter a slot therefor (not shown).

Upon rotating the actuating mechanism 7 clockwise to rotate the camming structure 9 clockwise and release the force thereof on hot plug channel member 5, the spring clips biasly compress according to their memory, thereby forcing hot plug channel member 5 (and, correspondingly, bracket 16 and PCI compliant card 21 held thereby) upward toward hot plug biasing mechanism 3, so that the PCI compliant card 21 can clear the slot, and the bracket 16 and PCI compliant card 21 can be slid along and out of hot plug channel member 5 and removed from the system.

Also shown in FIG. 1 is back lever and spring combination 8. Upon sliding the hot plug slide beam 17 entirely into channel 13 of hot plug channel member 5, according to one example and illustrative aspect of the present invention, the back lever is tripped and activates the spring (through any suitable mechanical or electromechanical arrangement), to cause vertical movement of the hot swap channel member 5 (and, correspondingly, vertical movement of the bracket 16 and PCI compliant card 21) downwardly, such that electrical contacts 23 of PCI compliant card 21 rest on the slot. Thereafter, front lever 7 is rotated so as to rotate the camming structure 9 and camming fingers 10, forcing the hot swap channel member 5 further downwardly so that the electrical contacts 23 of the PCI compliant card 21 are forced into the slot to provide proper electrical connection.

In an alternative embodiment, the back lever and spring combination 8 for moving the hot plug channel member downwardly can be avoided, by utilizing the front lever 7 for the totality of the vertical movement downwardly. In this example and illustrative aspect of the present invention, the camming structure 9, upon rotation around pivot 12, can force the hot plug channel member 5 from its uppermost position to its lowermost position; and the spring clips 11 force the hot plug channel member 5 from its lowermost position to its most upwardly position, after removal of pressure by rotating the camming structure 9 and fingers 10 upwardly away from the top surface of the hot plug channel member 5.

According to the structure wherein a back lever and spring combination 8 is used for partial movement of the hot plug channel member 5 from an uppermost position to an intermediate position, and wherein the front lever causes only partial movement downwardly of the hot plug channel member, two motions are necessary to connect electrical contacts 23 of PCI compliant cards 21 into respective slots. On the other hand, where all of the vertical movement is caused by movement of the front lever, only a single movement is necessary in order to engage (connect) electrical contacts 23 of the PCI compliant card 21 with electrical connectors in the slot therefor.

In any event, in structure utilizing such single motion or such two motions for engaging the PCI compliant cards 21 in the slots therefor, the structure includes a back lever and spring combination for ejecting the hot plug slide beam 17 of the bracket 16 (and, correspondingly, the PCI compliant card associated therewith) from the hot plug channel member 5. That is, upon raising of the hot plug channel member 5 and hot plug slide beam 17 therein to an uppermost position, closest to frame 14 of hot plug biasing mechanism 3, the back lever is triggered to push or eject the hot plug slide beam 17 out of the hot plug channel member 5.

Figure 3:
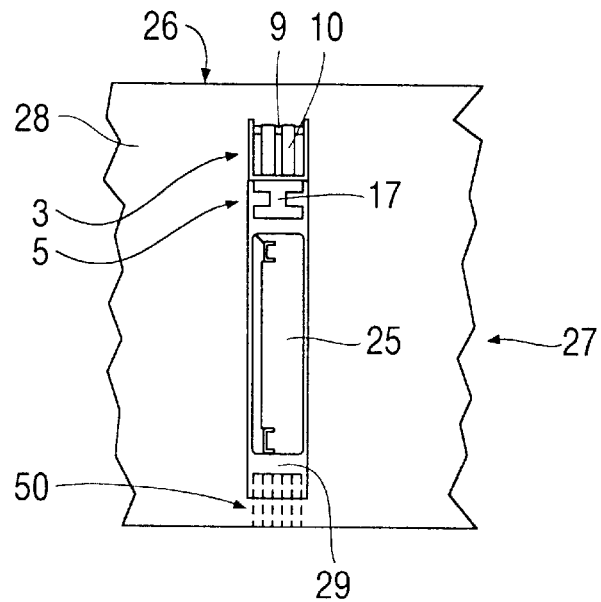
FIG. 3 is an end view of a computer system including an example of a hot plug structure according to an example and illustrative embodiment of the present invention.

FIG. 3 shows an example of a computer chassis structure (in cut-away form) according to an illustrative embodiment of the present invention, having a hot plug component according to embodiments of the present invention. Shown in FIG. 3 is a portion of computer chassis 27, having rear 28 of the frame structure and top 26, with a front opposite to rear 28, and having chassis opening 29 for facilitating insertion/removal of the PCI compliant card into/out of chassis 27. Shown in opening 29 is hot plug biasing mechanism 3, hot plug channel member 5 and PCI card bracket 25 (which is at the front end of the PCI compliant card). Also shown in FIG. 3 is hot plug slide beam 17 inserted in the channel of hot plug channel member 5, ready for downward movement therein. Further shown in FIG. 3, schematically, is slot 50, having, e.g., electrical connectors to contact electrical contacts of the PCI compliant card (contacts 23 of PCI compliant card 21 are shown in FIGS. 2 and 5).

Figure 4:
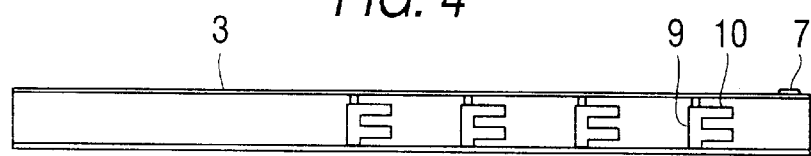
FIG. 4 is a top plan view of an example of a hot plug biasing mechanism according to an example and illustrative embodiment of the present invention.

FIG. 4 is a top view of the hot plug biasing mechanism 3, further showing the camming structure 9, with camming fingers 10.

Figure 6:
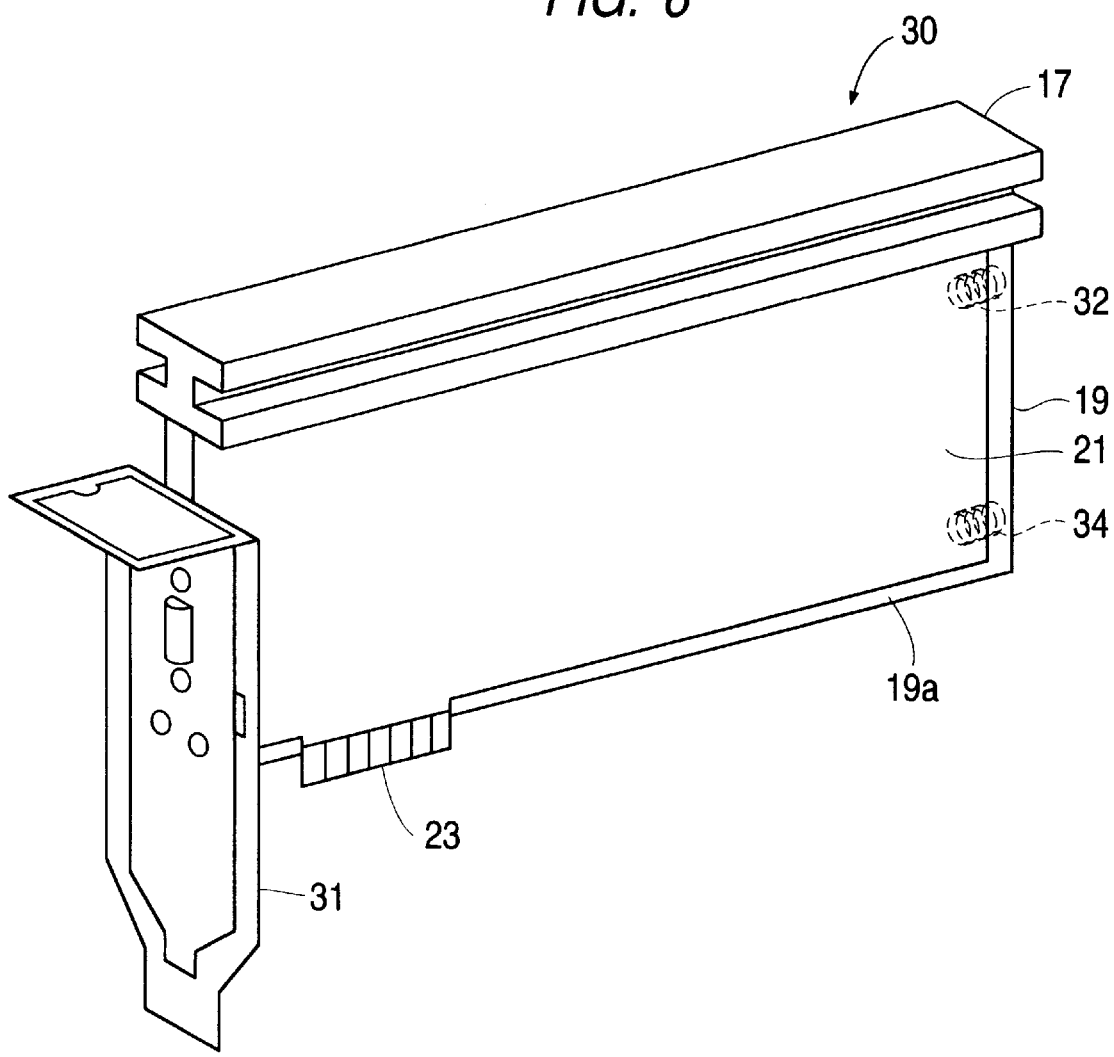
FIG. 6 is a perspective view of an example of a hot plug bracket according to another example and illustrative embodiment of the present invention.

FIG. 6 shows another example and illustrative embodiment of the bracket according to the present invention. In this embodiment hot plug bracket 30 holds PCI compliant card 21, having L-shaped bracket 31. The hot plug bracket 30 includes hot plug slide beam (cartridge) 17, with an H-shaped cross-sectional configuration, to slide into H-shaped opening 13 of hot plug channel member 5. According to this example and illustrative embodiment of the present invention, member 19 can be fixed to the PCI compliant card 21 (for example, at fixing positions 32, 34).

Figure 7:
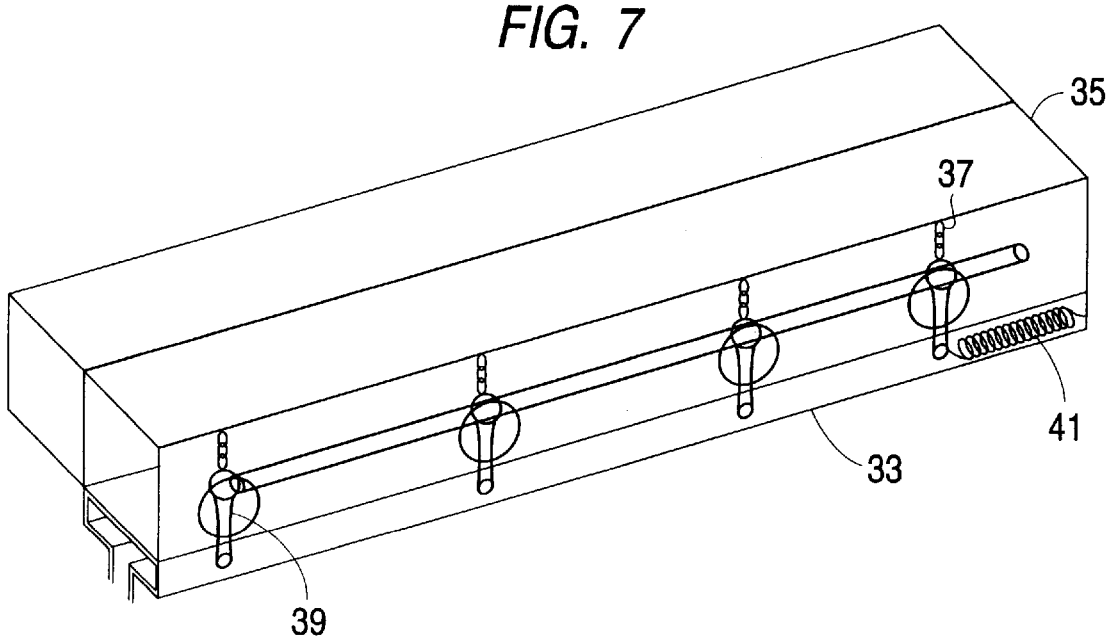
FIG. 7 is a perspective view of an example of a hot plug component, including an example of a hot plug biasing mechanism and hot plug channel member, according to another example and illustrative embodiment of the present invention.

FIG. 7 shows another example and illustrative embodiment according to the present invention, for urging the hot plug biasing mechanism 35 and hot plug channel member 33 toward each other when the PCI card contacts 23 are in the slot therefor. In this embodiment, connecting structure 39 is provided between the hot plug biasing mechanism 35 and hot plug channel member 33, respectively connected at outside surfaces of each. Also shown are springs 37, for urging the hot plug channel member 33 upwardly toward the hot plug biasing mechanism 35, upon removal of downward pressure on the hot plug channel member 33 from camming structure (not shown), as discussed previously. Also shown in FIG. 7 is spring 41, which is rendered operative upon upward movement of the hot plug channel member 33 triggering a back lever, to cause ejection (through any suitable mechanical or electro-mechanical arrangement) of the hot plug cartridge (and, correspondingly, the PCI compliant card attached thereto).

Figure 8:
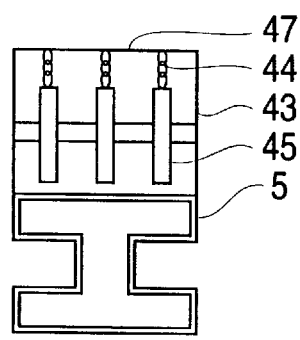
FIG. 8 is an end view of an example of a hot plug biasing mechanism and hot plug channel member according to another example and illustrative embodiment of the present invention.

FIG. 8 shows an end view of hot plug channel member 5 and hot plug biasing mechanism 43 of another example and illustrative embodiment of the present invention. This embodiment has, as the connecting structure between hot plug channel member 5 and hot plug biasing mechanism 43, connecting structure 45 and spring 44. As seen in this end view in FIG. 8, the elastic connection between hot plug channel member 5 and hot plug biasing mechanism 43 has a plurality of structures (in FIG. 8, three) across a width of hot plug biasing mechanism 43. In this embodiment shown in FIG. 8, the connecting structure extends from top surface 47 of hot plug biasing mechanism 43 to a top surface of hot plug channel member 5.

The components of the present invention (that is, the hot plug biasing mechanism and hot plug channel member, forming the hot plug component, and the hot plug slide beam (cartridge) and member, forming the bracket, can be partially or wholly made of sheet metal or plastic material, or any other suitable material.

Embodiments of the present invention will be described generally in connection with various additional aspects thereof, in the following. As can be appreciated, the present invention is not limited to these aspects or embodiments, but embraces all aspects and embodiments as covered by the appended claims and equivalents thereof.

Embodiments of the present invention provide structure, and methods, wherein a PCI compliant card can be engaged to, and disengaged from, a slot therefor of a system (for example, a computer, such as a server, desktop or workstation) without having to power down the system (e.g., computer) or remove any chassis components. Structure according to embodiments of the present invention do not require much space above the PCI compliant card; moreover, no internal chassis components need be exposed, when engaging/disengaging PCI compliant cards, since no covers have to be removed when adding/removing the PCI compliant cards. The present invention can be used to add/remove horizontally the PCI compliant cards, for engaging/disengaging the PCI compliant cards with/from slots therefor, from the rear of the system chassis (rather than from the top).

According to various illustrative aspects, the PCI compliant card can be held by the hot plug channel of the hot plug component. The hot plug channel member can then be moved, e.g., vertically, by moving the camming structure, with the PCI compliant card also moving correspondingly vertically, and the PCI compliant card is lowered to bring electrical contacts on the PCI compliant card into electrical contact with connectors in the slot on the base board of the system.

As an additional example and illustrative aspect of the present invention, the hot plug biasing mechanism also includes springs connected to the hot plug channel member. When the PCI compliant card is in the slot therefor, these springs are biased in a direction opposite the direction the PCI compliant card moves when entering the slot. Thus, when a downward force by the camming structure on the hot plug channel member is released while the PCI compliant card is in the slot, the springs provide an upward force on the hot plug channel member to raise the channel member and thereby disengage the PCI card (held by the channel) from the slot.

As another example and illustrative aspect of the present invention, this hot plug biasing mechanism can further include an ejection structure to eject the PCI compliant card from the hot plug channel member when the hot plug channel member has moved in a direction opposite to the first direction to disengage the PCI compliant card from the slot therefor in the base board of the computer.

As another example and illustrative aspect of the present invention, the PCI compliant card can be held in a bracket, which includes a hot plug cartridge extending along an entire length of a top surface of the PCI compliant card, this cartridge having a cross-sectional configuration so as to slide into the channel of the aforementioned hot plug channel member of the hot plug component and be held therein. This bracket can also include a member extending along at least a back end of the PCI compliant card (that is, the end of the PCI compliant card first entering the chassis of the system), this member being attachable to the PCI compliant card through any suitable means, e.g., screws.

Desirably, the hot plug cartridge of the bracket for the PCI compliant card, according to an example and illustrative embodiment of the present invention, is attached to the member which extends along at least a back end of the PCI compliant card, and is attached to the PCI compliant card. Preferably, this hot plug cartridge is integral with the member. As an additional configuration of the bracket, the aforementioned member is configured to extend along the bottom edge of the PCI compliant card, while permitting the electrical contacts on the bottom edge of the PCI compliant card to extend beneath this member so that these contacts can be electrically connected to connectors in the slot therefor on the base board of the computer.

As described previously, desirably the hot plug biasing mechanism includes structure to eject the PCI compliant card from the hot plug channel when the PCI compliant card has moved upward to clear away from the slot therefor. This ejection structure can include a spring tab which pushes out the PCI compliant card after the spring tab has been tripped upon upward movement of the hot plug channel member to automatically disengage the PCI compliant card from the slot therefor. According to an aspect of the present invention wherein the PCI compliant card is held in a bracket and the hot plug cartridge of the bracket is slid into the hot plug channel member, the ejection structure pushes out the hot plug cartridge (and PCI compliant card held by the bracket) to provide easy removal of the PCI compliant card from the computer chassis through, e.g., an opening in the rear of the chassis.

Various different actuating mechanisms can be utilized, for causing movement of the camming structure, in examples and illustrative embodiments of the present invention. For example, and not to be limiting, a lever can be provided on the front of the hot plug biasing mechanism (that is, the front of the hot plug biasing mechanism being the part of the hot plug biasing mechanism exposed through an opening of the chassis). Alternatively, a button can be provided on the chassis, adjacent the opening exposing the hot plug component, which when pressed activates movement of the camming structure.

According to an additional example and illustrative aspect of the present invention, the hot plug biasing mechanism and hot plug channel member can be positioned (mounted) horizontally in the chassis of the computer (e.g., mounted on the chassis), a frame of the hot plug biasing mechanism being fixed on the chassis and the hot plug channel member being movable relative thereto. The hot plug channel member is exposed through an opening in the rear of the chassis, the PCI compliant card being added and removed, e.g., from the rear of the chassis by sliding the PCI compliant card horizontally into and out from the channel of the hot plug channel member. According to this example and illustrative aspect of the present invention, the PCI compliant card is held by the hot plug channel member so that electrical contacts on the bottom edge of the PCI compliant card overlie the associated electrical connectors in the slot therefor (these connectors being electrically connected to appropriate busses), and the hot plug channel member is moved vertically downwardly when the camming structure moves, to cause engagement of the electrical contacts on the bottom edge of the PCI compliant card to the associated connectors in the slot therefor.

According to a further example and illustrative aspect of the present invention, the camming structure operates to move the hot plug channel member in the first direction, from a first position where the PCI compliant card is introduced to the hot plug channel member, to a second position where the PCI compliant card engages the slot for the card. According to this example and illustrative aspect of the present invention, all movement of the hot plug channel member toward the slot is governed by movement of the camming structure. In this example and illustrative aspect, springs biased in a direction away from the slot can be used to disengage the PCI compliant card from the slot and raise the hot plug channel member (and PCI compliant card held thereby) from the second position back to the first position, where the PCI compliant card is removed, when a force on the channel member in the first direction, generated by the camming structure, is removed.

According to still another example and illustrative aspect of the present invention, the camming structure operates to move the hot plug channel member from an intermediate position, between a first position where the PCI compliant card is introduced to the hot plug channel member and a second position where the PCI compliant card engages the slot therefor, to this second position. According to this further example and illustrative aspect of the present invention, the hot plug biasing mechanism further includes a back lever and springs, the springs being activated when the back lever is tripped to move the hot plug channel member from the first position (where the PCI compliant card is introduced) to the intermediate position. The back lever can be tripped, for example, upon sliding the bracket holding the PCI compliant card into the hot plug channel member such that the cartridge of the bracket extends to the back of the channel member and trips the back lever. This lowering mechanism whereby the back lever is tripped to lower the hot plug channel member to an intermediate position (e.g., where the electrical contacts of the PCI compliant card just rest on the slot) is similar to the lowering mechanism of a floppy disk drive.

In this example and illustrative aspect of the present invention, wherein springs lower the hot plug channel member to the intermediate position, clips can be connected to the hot plug channel member and, e.g., to the front lever (the actuating mechanism) so that continued movement of the front lever (after removing the downward force by the camming structure by movement of the front lever) overrides the springs (the springs having a memory to the intermediate position) and moves the hot plug channel member back to the first position where the PCI compliant card can be removed.

Embodiments of the present invention, as examples and illustrative aspects thereof, further contemplate a hot plug structure, including the hot plug component as previously described (which includes the hot plug biasing mechanism and hot plug channel member) and the bracket for holding the PCI compliant card, this bracket being slidable into the hot plug channel member so as to be held therein. According to these examples and illustrative aspects of the present invention, the bracket can include the hot plug cartridge and the member extending along at least a back end of the PCI compliant card and attached to the PCI compliant card, as discussed previously.

Embodiments of the present invention also contemplate, as a part thereof, chassis structure of a computer, having the aforementioned hot plug component and a frame structure. The frame structure has openings therein through which PCI compliant cards can be passed, to be held by the hot plug channel member, in order to be respectively inserted into slots in a base board of the computer. The hot plug component is exposed through one of these openings, and positioned with respect to this opening and an associated slot such that a PCI compliant card can be held by the hot plug channel member of the hot plug component and moved into the associated slot by the hot plug biasing mechanism of the hot plug component. In this chassis structure, the openings can be in a rear of the frame structure (the frame structure including a top and a front in addition to this rear). The hot plug component can be horizontal in this chassis structure, and, e.g., can be mounted on the frame. The chassis structure can include a plurality of openings, with each opening being for insertion of a PCI compliant card and each opening having associated therewith a hot plug component according to the present invention and a slot.

Embodiments of the present invention also contemplate, as an example and illustrative aspect thereof, a computer system having the aforementioned chassis structure and a bracket for the PCI compliant card as discussed previously.

Additional example and illustrative aspects of the present invention include methods for engaging/disengaging PCI compliant cards with/from slots therefor. In one illustrative method, the PCI compliant card is slid along a hot plug channel member of a hot plug component, described previously, so as to be held by the hot plug channel member, the hot plug channel member being located at a first position. Thereafter, the hot plug channel member is moved to a second position, the PCI compliant card moving therewith, the second position being a position at which the PCI compliant card held by the hot plug channel member is engaged to a slot.

In additional embodiments, the hot plug channel can be moved from the first position to the second position by a single movement of the hot plug channel member, actuated by an actuating mechanism at the front of the hot plug component.

In alternative embodiments, the hot plug channel member can be moved from the aforementioned first position to an intermediate position between the first and second positions, and then the hot plug channel can be moved from the intermediate position to the second position. The first movement, to the intermediate position from the first position, is desirably initiated by sliding the PCI compliant card into the hot plug channel member to trigger a spring at the rear of this channel member, and the second movement form the intermediate position, is performed by moving a camming structure of the hot plug component, e.g., actuated by an actuating mechanism at the front of the hot plug component.

As a further example and illustrative embodiment of the method of the present invention, the PCI compliant card is disengaged from the slot, by moving the hot plug channel member back to the first position and ejecting the PCI card from the hot plug channel member at this first position. This disengagement of the PCI compliant card from the slot can be a separate processing within embodiments of the present invention.

Accordingly, by the present invention, structure and methods are provided whereby a PCI compliant card can be engaged and disengaged from a slot on a base board of a system (e.g., computer), without having to power down the system or remove any chassis components, or even expose any internal components (since no covers have to be removed). According to embodiments of the present invention, the PCI compliant card can be removed from the rear of the computer, and the mechanism according to the present invention does not require much space above the computer. Thus, a simple and compact technique is achieved for hot plugging and unplugging PCI compliant cards.

As a final note, it should be apparent that the combination arrangement of the present invention may also have use in other technical fields besides computers and with bus structures other than PCI busses, e.g., may be suited for use in the telephone switching field to hot plug and unplug printed circuit boards with respect to a bus system. By PCI compliant cards in the appended claims, we also include other hot pluggable components, including the aforementioned printed circuit boards.

While there have been shown and described several embodiments in accordance with the present invention, it is understood that the same is not limited thereto, but is susceptible of numerous changes and modifications as known to those skilled in the art. Therefore, the invention is not limited to the details shown and described herein, but is intended is to cover all such changes and modifications as are encompassed by the scope of the appended claims, including equivalents thereof.

We claim:

1. A hot plug component, comprising:
    a hot plug biasing mechanism; and
    a hot plug channel member, for holding a peripheral component interconnect compliant card, integrated with the hot plug biasing mechanism,
    wherein the hot plug biasing mechanism includes a camming structure, the hot plug channel member being adapted to co-act with the camming structure to move the hot plug channel member so the peripheral component interconnect compliant card enters a slot, to engage the peripheral component interconnect compliant card in the slot, when the camming structure moves in a first direction, and wherein the hot plug biasing mechanism further comprises a spring connected to the hot plug channel member and biased in a direction opposite said first direction when the peripheral component interconnect compliant card is engaged with said slot.

2. The hot plug component according to claim 1, further comprising an actuating mechanism, wherein movement of the camming structure is activated by the actuating mechanism, and wherein said actuating mechanism is a front lever which moves the camming structure and a button which initiates movement of the camming.

3. The hot plug component according to claim 1, wherein the hot plug biasing mechanism and the hot plug channel member are each positioned horizontally, and wherein the hot plug channel member is adapted to be moved vertically downwardly when the camming structure moves in the first direction.

4. The hot plug component according to claim 1, wherein said camming structure is adapted to operate to move the hot plug channel member from a first position where the peripheral component interconnect card is introduced to the hot plug channel, to a second position where the peripheral component interconnect card engages the slot.

5. The hot plug component according to claim 1, wherein said camming structure is adapted to operate to move the hot plug channel member from an intermediate position, between a first position where the peripheral component interconnect card is introduced to the hot plug channel member and a second position where the peripheral component interconnect card engages the slot, to said second position; and wherein the hot plug biasing mechanism further comprises a back lever and springs, the springs being activated to move the hot plug channel member from said first position to the intermediate position when said back lever is tripped.

6. A bracket for a peripheral component interconnect compliant card, comprising:
    a hot plug cartridge to extend along an entire length of a top surface of the peripheral component interconnect compliant card, said hot plug cartridge having a cross-sectional configuration so as to slide into a hot plug channel member of a hot plug biasing mechanism and be held therein, wherein the hot plug cartridge is H-shaped in cross-section, and can slide into an H-shaped opening of the hot plug channel member; and
    an attachment member to extend along at least a back end of the peripheral component interconnect compliant card and having structure to attach to said peripheral component interconnect compliant card.

7. The bracket according to claim 6, wherein the hot plug cartridge is attached to said attachment member.

8. The bracket according to claim 6, wherein the hot plug cartridge is integral with said attachment member.

9. The bracket according to claim 6, wherein said member is configured so as to extend along said back end and a bottom edge of the PCI compliant card, and to permit electrical contacts on the bottom edge of the PCI compliant card to extend beneath said member.

10. Hot plug structure, comprising:
    the hot plug component according to claim 1; and
    a bracket for holding the peripheral component interconnect compliant card, the bracket being adapted to slide into said hot plug channel member so as to be held therein.

11. Hot plug structure according to claim 10, wherein said bracket includes:
    a hot plug cartridge to extend along an entire length of a top surface of the peripheral component interconnect compliant card, said hot plug cartridge having a cross-sectional configuration so as to slide into the hot plug channel member of the hot plug biasing mechanism and be held therein; and
    an attachment member to extend along at least a rear end of the peripheral component interconnect compliant card and having structure to attach to said peripheral component interconnect compliant card.

12. Chassis structure of a computer, comprising:
    a frame structure, having openings therein through which peripheral component interconnect compliant cards can be passed so as to be respectively inserted into slots in a baseboard of the computer; and
    the hot plug component according to claim 1, exposed through one of said openings, and positioned with respect to said one of said openings and a slot, of said slots associated with said one of said openings such that a peripheral component interconnect compliant card of said peripheral component interconnect compliant card can be held in the hot plug channel member of the hot plug component and moved into said slot associated with said one of said openings by said hot plug biasing mechanism.

13. Chassis structure according to claim 12, wherein the frame structure includes a top, a front and a rear, and wherein said openings are in said rear of the frame structure.

14. Chassis structure according to claim 13, wherein said hot plug component is horizontal.

15. Computer system comprising the chassis structure according to claim 13, and a bracket for the peripheral component interconnect compliant card.

16. Computer system according to claim 15, wherein the bracket comprises:

a hot plug cartridge to extend along an entire length of a top surface of the peripheral component interconnect compliant card, said hot plug cartridge having a cross-sectional configuration so as to slide into the hot plug channel member of the hot plug biasing mechanism and be held therein; and an attachment member to extend along at least a rear end of the peripheral component interconnect compliant card and having structure to attach to said peripheral component interconnect compliant card, and wherein the computer system further includes said peripheral component interconnect compliant card held by said bracket.

17. Computer system comprising the chassis structure according to claim 12, and a bracket for the peripheral component interconnect compliant card.

18. Computer system according to claim 11, further comprising a peripheral component interconnect compliant card, held by said bracket.

19. A method of engaging a peripheral component interconnect compliant card to a slot, comprising:

sliding the peripheral component interconnect compliant card along a hot plug channel member of a hot plug component, so as to be held by the hot plug channel member, with the hot plug channel member located at a first position; and moving the hot plug channel member to a second position, the peripheral component interconnect compliant card moving therewith, the second position being a position at which the peripheral component interconnect compliant card held by the hot plug channel member is engaged to said slot, wherein said moving the hot plug channel member includes moving the hot plug channel member from the first position to an intermediate position between the first and second positions, and then moving the hot plug channel member from the intermediate position to the second position, wherein said moving the hot plug channel member from the first position to the intermediate position is initiated by sliding the peripheral component interconnect compliant card into the hot plug channel member, and wherein moving the hot plug channel member from the intermediate position to the second position is performed by moving a camming structure of the hot plug component.

20. The method according to claim 19, wherein said moving the hot plug channel member moves the hot plug channel member from the first position to the second position by a single movement of the hot plug channel member, actuated by an actuating mechanism at the front of the hot plug component.

21. The method according to claim 19, wherein the peripheral component interconnect compliant card is supported by a bracket; and in said sliding said peripheral component interconnect compliant card, said bracket is slid into a channel of said hot plug channel member.

22. The method according to claim 19, further comprising disengaging the peripheral component interconnect compliant card from the slot, by moving the hot plug channel member back to said first position, and ejecting the peripheral component compliant card from said hot plug channel member at said first position.

23. A bracket for a peripheral component interconnect compliant card, comprising:

a hot plug cartridge to extend along an entire length of a top surface of the peripheral component interconnect compliant card, said hot plug cartridge having a cross-sectional configuration so as to slide into a hot plug channel member of a hot plug biasing mechanism and be held therein; and an attachment member to extend along at least a back end of the peripheral component interconnect compliant card and having structure to attach to said peripheral component interconnect compliant card, wherein said attachment member is configured so as to extend along said back end and a bottom edge of the peripheral component interconnect compliant card, and to permit electrical contacts on the bottom edge of the peripheral component interconnect compliant card to extend beneath said attachment member.

\* \* \* \* \*